United States Patent [19]

Herbots et al.

[11] Patent Number: 5,241,214
[45] Date of Patent: Aug. 31, 1993

[54] OXIDES AND NITRIDES OF METASTABALE GROUP IV ALLOYS AND NITRIDES OF GROUP IV ELEMENTS AND SEMICONDUCTOR DEVICES FORMED THEREOF

[75] Inventors: Nicole Herbots, Arlington; Olof C. Hellman, Cambridge; Olivier P. J. Vancauwenberghe, Somerville, all of Mass.

[73] Assignee: Massachusetts Institute of Technology, Cambridge, Mass.

[21] Appl. No.: 693,330

[22] Filed: Apr. 29, 1991

[51] Int. Cl.$^5$ .................. H01L 29/78; H01L 29/20; H01L 27/02; H01L 29/34

[52] U.S. Cl. .................. 257/649; 257/192; 257/197; 257/289; 257/370; 257/410; 257/411; 257/565; 257/651

[58] Field of Search .................. 357/4, 26, 23.2, 23.15, 357/34, 42, 43, 54; 257/193, 197, 289, 370, 410, 411, 565, 649, 651

[56] References Cited

U.S. PATENT DOCUMENTS

| | | | |
|---|---|---|---|
| 4,317,686 | 3/1982 | Anand et al. | 357/91 |
| 4,402,762 | 9/1983 | John et al. | |
| 4,522,886 | 6/1985 | Chin et al. | |
| 4,529,455 | 7/1985 | Bean et al. | 357/4 |
| 4,556,895 | 12/1985 | Ohata | 357/16 |
| 4,649,059 | 3/1987 | Eden et al. | |
| 4,683,482 | 7/1987 | Ueyanagi et al. | 357/16 |
| 4,800,100 | 1/1989 | Herbots et al. | 427/38 |
| 5,008,723 | 4/1991 | van der Have | |
| 5,041,892 | 8/1991 | Yano et al. | 357/40 |
| 5,155,557 | 10/1992 | Wang et al. | 357/42 |

FOREIGN PATENT DOCUMENTS

| | | |
|---|---|---|
| 2719464 | 12/1978 | Fed. Rep. of Germany ........ 357/34 |
| 62-18758 | 1/1987 | Japan . |
| 1-241171 | 9/1989 | Japan . |
| 1235276 | 9/1989 | Japan . |
| 2-196436 | 8/1990 | Japan . |
| WO92/09108 | 5/1992 | PCT Int'l Appl. . |

OTHER PUBLICATIONS

J. E. Castle et al., "Synthesis of oxides in $Si_{0.5}Ge_{0.5}$ alloy by high dose oxygen ion implantation", *Materials Science and Engineering*, B12 (1992) pp. 199–203.

D. C. Paine et al., "Oxidation of $Si_{1-x}Ge_x$ alloys at atmospheric and elevated pressure", *Journal of Applied Physics*, 70(9) (Nov. 1, 1991) pp. 5076–5084.

W. S. Liu et al., "Wet oxidation of GeSi at 700° C.", *Journal of Applied Physics*, 71(8) (Apr. 15, 1992) pp. 4015–4018.

W. S. Liu et al., "Wet oxidation of epitaxial $Ge_{.36}Si_{.64}$ on (100)Si", *Mat. Res. Soc. Symp. Proc.* vol. 220 (1991) pp. 259–263.

Iyer et al., "Narrow Band Gap Base Heterojunction Bipolar Transistors Using Si-Ge Alloys," *Thin Solid Films*, 184(1): 153–162 (1990).

Bean et al., "Pseudomorphic Growth of $Ge_xSi_{1-x}$ on Silicon by Molecular Beam Epitaxy," *Appl. Phys. Lett.*, 44(1): 102–104 (1984).

Thomas, G. E., et al., *Appl. Phys. Lett.*, 41(1): 56–59, (1982).

Taylor, J. A., et al., *J. Chem. Phys.*, 68(4): 1776–1784, (1978).

Wilson, R. G., et al., *Robert E. Krieger Publishing*, Chapter 3: 129–259, (1979).

Freeman, J. H., et al., *Vacuum*, 34(1–2): 305–314, (1984).

Troxell, J. R., et al., *J. Electrochem. Soc.*, 131(10): 2353–2359, (1984).

Herbots, N., et al., *Mat. Res. Soc. Symp. Proc.*, 51: 369–374, (1985).

(List continued on next page.)

*Primary Examiner*—J. Carroll
*Attorney, Agent, or Firm*—Hamilton, Brook, Smith & Reynolds

[57] ABSTRACT

A process and resultant devices is described for forming MOSFET, CMOS and BICMOS devices of Group IV alloys, in particular $Si_xGe_{1-x}$ wherein $0 < x < 1$, using ion beam oxidation (IBO) or ion beam nitridation (IBN) by CIMD to form insulators of the Group IV alloys.

17 Claims, 7 Drawing Sheets

OTHER PUBLICATIONS

Herbots, N., et al., *Nucl. Instr. and Meth.*, B13: 250–258, (1986).

Herbots, N., et al., *Proc. of the N.E. Regional Mtg. of the Metallurgical Soc.*, 335–349, (1986).

Todorov, S. S., et al., *IEEE Electron Device Lett.*, EDL-7(8): 468–470, (1986).

Zuhr, R. A., et al., *MRS Proc.*, (1987) 9 pages.

Appleton, B.R., et al., *Nucl. Instr. and Meth.*, B19/20: 975–982, (1987).

Appleton, B. R., et al., *MRS Bulletin*, (1987).

Holland, O. W., et al., *Appl. Phys. Lett.*, 51(7): 520–522, (1987).

Hemment, P. L. F., *EMIS Data Review*, 717–721, (1987).

Dumin, D. J., et al., *Mat. Res. Soc. Symp. Proc.*, 93: 137–142, (1987).

Cuomo, J. J. et al., *Nucl. Instr. and Meth.*, B19/20: 963–974, (1987).

Donovan, E. P., et al., *Nucl. Instru. and Meth.*, B19/20: 983–986, (1987).

Herbots, N., et al., *Amer. Vac. Soc. Series 4*, 167: 229–259, (1988).

Hecht, M. H., et al., *Appl. Phys. Lett.*, 54(5): 421–423, (1989).

LeGoues, F. K., et al., *Appl. Phys. Lett.*, 54(7): 644–646, (1989).

Ito, H., et al., *J. Vac. Sci. Technol.*, B7(6): 1963–1966, (1989).

Grabowski, K. S., et al., *Nucl. Instr. and Meth.*, B39: 190–193, (1989).

Mayer, J. W., et al., *Electronic Materials Science: For Integrated Circuits in Si and GaAs*, p. 270.

Olson, J. L., "Structural Characterization of Silicon Germanium Dielectric Thin Films Grown by Combined Ion and Molecular Beam Deposition (CIMD)", (unpublished).

Vancauwenberghe, O., et al., "Ion Beam Oxidation of GaAs: The Role of Ion Energy", (unpublished).

Vancauwenberghe, O. et al., "A Quantitative Model of Point Defect Diffusivity and Recombination in Ion Beam Deposition (IBD) & Combined Ion and Molecular Deposition (CIMD)", (unpublished).

Herbots, N., et al., "Atomic Collisions, Elastic Recombination, and Thermal Diffusion During Thin Film Growth from Low Energy Ion Beams", (unpublished).

Herbots, N. et al., "Room Temperature Growth of Si, Ge, and $Si_xGe_{1-x}$ Insulators for High Mobility $Si_xGe_{1-x}$ Devices", (unpublished).

Vancauwenberghe, O., et al., "Room Temperature Nitridation and Oxidation of Si, Ge and MBE-Grown SiGe using Low Energy Ion Beams (0.1–1 keV)", (unpublished).

Vancauwenberghe, O., et al., "New SiGe Dielectrics Grown at Room Temperature by Low Energy Ion Beam Oxidation (IBO) and Nitridation (IBN)", (unpublished).

Vancauwenberghe, O., et al., "Comparitive Study of Low Energy Ion Beam Oxidation of Si (100), Ge/Si (100) and $Si_{1-x}Ge_xSi$ (100)", (unpublished).

Hellman, O. C. et al., "Structure and Properties of Si Nitride and $Si_xGe_{1-x}$ Nitride Prepared by Direct Low Energy Ion Beam Nitration", (unpublished).

King, C. A., et al., "Si/$Si_{i-x}Ge_x$ Heterojunction Bipolar Transistors Produced by Limited Reaction Processing", (unpublished).

Schlom, D. G., et al., "Molecular Beam Epitaxy of Layered Dy-Ba-Cu-O Compounds", (unpublished).

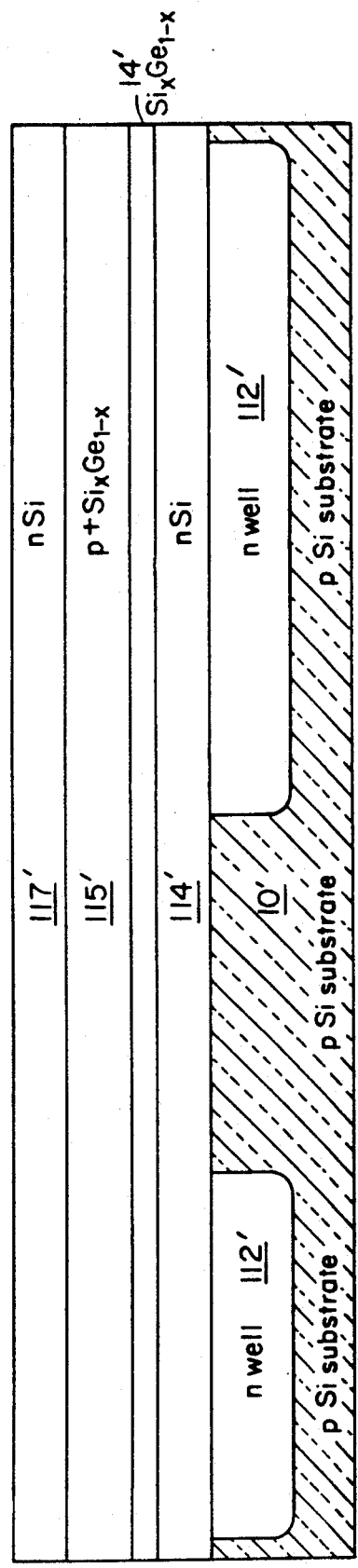
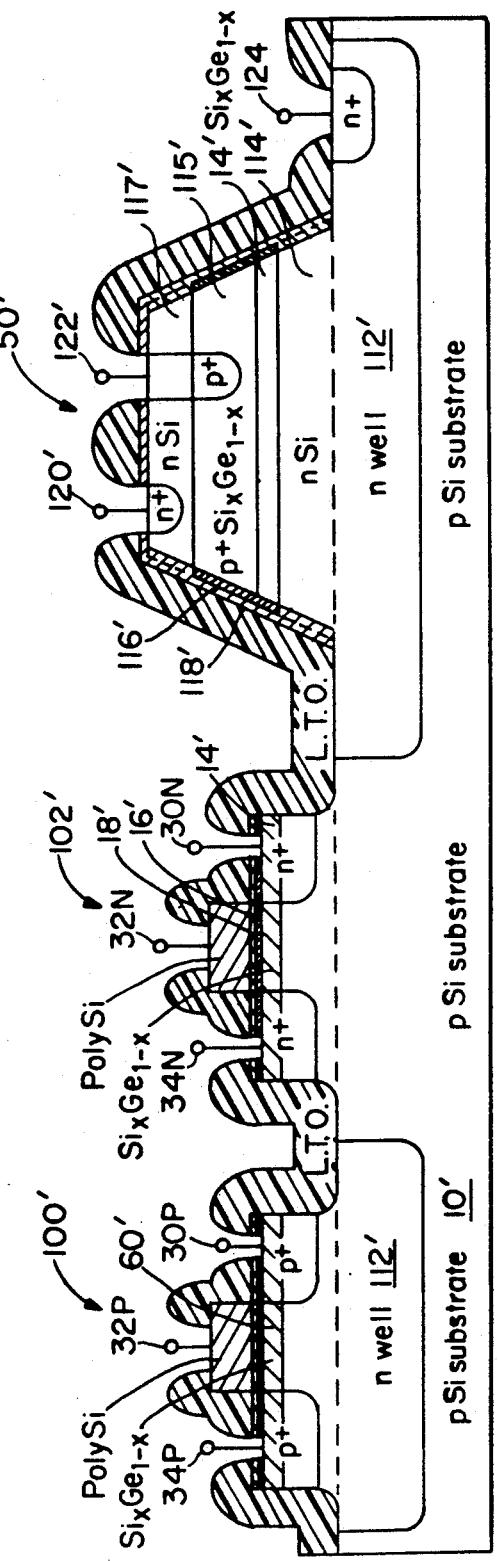
Fig. 3a
Fig. 3b

OXIDES AND NITRIDES OF METASTABALE GROUP IV ALLOYS AND NITRIDES OF GROUP IV ELEMENTS AND SEMICONDUCTOR DEVICES FORMED THEREOF

BACKGROUND OF THE INVENTION

Group IV semiconductors form an important class of electronic materials which can be used to implement new, high mobility devices. These materials include in particular, Si, Ge and their alloys, ($Si_xGe_{1-x}$) wherein $0<x<1$. Most of the research and development on ($Si_xGe_{1-x}$) devices has focused on the creation of high quality heteroepitaxial ($Si_xGe_{1-x}$) layers on Si substrates to take advantage of the higher carrier mobilities provided by Ge (3900$\nu$1500 electron mobility cm$^2$/V-sec at 300K°) and to engineer bandgap properties. The bandgap of Si is 1.1 eV and Ge is 0.7 eV, therefore, $Si_xGe_{1-x}$ alloys can be formed having bandgaps intermediate these values. Stacked or layered structures of Si/Ge alloys can be used to form quantum wells. One of the keypoints of such research is the choice of the alloy composition, which determines both the bandgap and the limits of heteroepitaxy: the larger the amount of Ge, the more difficult the elimination of defects. Another keypoint is the kinetic path and/or the processing sequence by which these materials are grown. Since these heteroepitaxial structures are metastable, the choice of the kinetic path or processing sequence determines the limit on the microstructural perfection of both the interface and the ($Si_xGe_{1-x}$) layer. Once the basic $Si_xGe_{1-x}$ structures are grown to a high degree of perfection they still need to be processed further to be made into operational devices. However, the metastability of these structures strongly limits thermal processing required to convert these structures into devices.

Promising results for ($Si_xGe_{1-x}$) manufacturing technology have previously been demonstrated: a ($Si_{0.8}Ge_{0.2}$)/Si Heterojunction Bipolar Transistor (HBT) with a gain four times larger than that of a Si homojunction bipolar transistor was fabricated at Stanford University in 1988 [C. A. King, J. L. Hoyt, C. M. Gronet, J. F. Gibbons, M. P. Scott and J. Turner, IEEE Elec. Dev. Lett., 10, 52, (1989)]. But little progress has been made in the specific area of processing ($Si_xGe_{1-x}$) heterostructures for the purpose of integrating devices. One important problem is the formation of an adequate passivation layer and a good quality dielectric on heteroepitaxial ($Si_xGe_{1-x}$) structures. Typical passivation layers and dielectrics for silicon based devices are silicon nitrides and silicon oxides. But presently those skilled in the art have been frustrated in attempts to grow oxides and nitrides of $Si_xGe_{1-x}$. For example, if $Si_xGe_{1-x}$ structures are subjected to conventional thermal oxidation, the ($Si_xGe_{1-x}$) decompose and the bandgap engineering is lost [O. W. Holland, C. W. White and D. Fathy, Appl. Phys. Lett., 51 (7), 520-2 (1987)]. The authors of the above-reference report that during steam oxidation of Ge ions in Si "the implanted Ge is totally rejected by the growing oxide leading to the formation of an almost pure layer of Ge between the oxide and underlying Si." p. 520. More recently, LeGoues et al. Appl. Phys. Lett. (7) p. 644 (1989) attempted to oxidize $Si_xGe_{1-x}$ formed by UHVCVD at 550 C. The samples were oxidized in steam at 800° C. and by dry $O_2$ at 800° and 1000° C. with the same result—Ge is rejected from the oxide and piled up at the $SiO_2$/Si interface.

U.S. Pat. No. 4,800,100 issued 24 January 1989 to Herbots et al. and Herbots et al. in AVS4, AIP Vol. 167, pp 229-250 (1988) "Semiconductor-Based Heterostructure Formation Using Low Energy Ion Beams: Ion Beam Deposition (IBD) and Combined Ion Beam Deposition (CIMD)" disclose a process for growing thin films by using simultaneously, concurrently, or sequentially molecular beam evaporation (MBE) and ion beam deposition (IBD) within a single chamber i.e. without breaking vacuum. They also disclose a number of potential uses of the CIMD process for growing oxides or nitrides, such as, oxides of GaAs; Ge based oxides, and silicon oxides, nitrides, or oxynitrides, formed on germanium or aluminum arsenide substrates with atomically sharp interfaces. In the growth of these materials by CIMD, the oxygen species is provided by the ion beam and the other species by molecular beams.

According to Herbots et al. a typical process would proceed as follows:

(a) GaAs is supplied from a Ga molecular beam and As from molecular beam to form a GaAs film on a substrate.

(b) The molecular beams are switched "off" while, simultaneously, an oxygen or nitrogen ion beam is switched "on" and an Si molecular beam, also switched "on". A low temperature Si oxide or nitride is thereby deposited on the GaAs substrate, forming a heterodielectric structure. Other examples suggested comprise Si oxides or nitrides on Ge, InP, AlGaAs, and CdTe.

Recently, oxidation of stable phase pure Si has been accomplished, "Todorov et al., *IEEE Electron Device Letters*, Vol. EDL-7, No. 8 Aug. 1986, Herbots et al., AIP Vol. 167 supra. But the formation of oxides and nitrides on a completely metastable material, such as, $Si_xGe_{1-x}$/Si heteroepitaxial films is much more difficult. The $Si_xGe_{1-x}$ films decompose under thermal treatment and their behavior is unpredictable due to their non-equilibrium nature. For example, one could have expected that the Si in the Si-Ge alloy would have enhanced thermal oxidation if the SiGe were in the equilibrium phase. However, as noted above, the opposite occurs and the alloy decomposes.

This process limitation is critical if silicon germanium alloys are to be used in Metal Oxide Silicon (MOS) technology for high speed digital electronics. Indeed, if the channel region of a MOS Field Effect Transistor (MOSFET) is made of ($Si_xGe_{1-x}$) to take advantage of the high carrier mobilities of the material, a solution must be found to the problem of growing a reliable dielectric gate material with a good quality interface on top of it.

A need exists therefore for a process of reliably forming an oxide or nitride of a Group IV alloy such as $Si_xGe_{1-x}$ for the reasons stated above.

SUMMARY OF THE INVENTION

The invention in general comprises the formation of new metastable oxides or nitrides of metastable Group IV heteroepitaxial films. More specifically, in accordance with the invention oxides of silicon germanium alloys are grown on silicon germanium alloys formed on silicon substrates [Si/$Si_xGe_{1-x}$)/($Si_xGe_{1-x}$)$O_y$] also nitrides of silicon germanium alloys are grown on silicon germanium alloys formed on silicon substrates [Si/$Si_xGe_{1-x}$)/($Si_xGe_{1-x}$)$N_z$]. These structures can be used for a ($Si_xGe_{1-x}$)MOS device, a SiGe HBT, or for other integrated devices and combinations thereof. The oxide or nitride structures are formed in accordance with the invention using a low energy ion beam process. Silicon nitrides on silicon substrates [Si/SiN$_z$] and germanium nitride on germanium substrates [Ge/GeN$_z$] using low energy ion beams are also formed in accordance with the nitride method of the invention wherein the strain in the formed films can be predictably controlled by varying the ion beam energy and process temperature.

The method comprises introduction of oxygen or nitrogen into the grown IV semiconductor or IV semiconductor alloy using a low energy ion beam (0.15-3 keV with 0.1 to 1 keV being most preferred). The use of the ion kinetic energy allows the introduction of atomic species 0.5 to 10 nm below the surface without using high temperature processing. Because point defects created in the ion collision are mobile at room temperature, the solid reaction progresses beyond the implantation/damage region and forms an atomically sharp interface comparable to that found in thermal oxides, with film thicknesses larger than the ion range.

The Group IV elements and alloys are formed as thin films, preferably on Si, using a molecular beam epitaxy (MBE) process in a CIMD reactor. This material is then oxidized or nitridized by Ion Beam Oxidation (IBO) or Ion Beam Nitridation (IBN) respectively in situ and the oxide or nitride layer is then covered with a protective capping layer, also in situ so that the oxide or nitride layers are protected from the environment when removed from the reactor. Preferably, the capping layer comprises SiO$_2$ formed of Si, deposited by MBE co-deposited with O$_2$ from the ion beam in a CIMD chamber.

The method of the invention enables the creation of Group IV oxide and nitride materials never grown before, such as, (Si$_x$Ge$_{1-x}$)O$_y$, (Si$_x$Ge$_{1-x}$)N$_z$, GeN. and SiN$_z$, It is contemplated that other Group IV alloys, such as, SiC, SiSn, GeSn can be oxidized or nitrized in this manner. These materials are unique in their compositions, their homogeneity, and in their controlled thicknesses and clean interfaces. The process used to grow these materials occurs at relatively low temperatures (300K to 700K). The direct ion beam provides the deposited species in an Ultra High Vacuum (UHV) environment. The growth of SiGe oxides by IBO has the potential of making a strong impact in the integration of (Si$_x$Ge$_{1-x}$) structures and (Si$_x$Ge$_{1-x}$) based devices.

Specifically, the growth of insulators on (Si$_x$Ge$_{1-x}$) makes possible the fabrication of MIS (Metal-Insulator-Semiconductor) devices using the ion beam formed insulator as the gate dielectric. It also makes possible the patterning and passivation of multi-layer structures used for (Si$_x$Ge$_{1-x}$)-based HBTs. Used in tandem, the combination of (Si$_x$Ge$_{1-x}$) based MIS-devices and HBT technology will result in a truly integrated hybrid technology, resulting in the combination of high-speed, high-gain and low power complementary devices.

Nitrides formed using ion beam nitridation are superior to conventional nitrides in their mechanical properties such as homogeneity, strength and adherence. In addition, a room temperature process for encapsulation is preferred over a higher temperature process. The low temperature synthesis of a silicon nitride phase also makes possible a new method of encapsulation, the process used to protect devices from environment-induced degradation.

BRIEF DESCRIPTION OF THE DRAWINGS

FIG. 3A is a schematic cross-section of a precursor structure for a SiGe Bipolar Transistor and CMOS (BICMOS) formed on a single substrate.

FIG. 3B is a schematic cross-section of the completed structure of FIG. 3A.

DETAILED DESCRIPTION OF THE INVENTION

A. MOS Structures

Figure 1A:
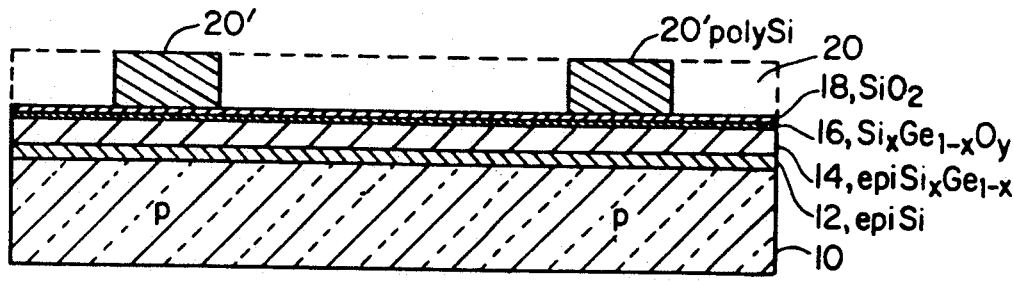
FIG. 1a-1d is a schematic cross-sectional flow diagram of the main steps in a process for forming N-type MOSFETS in accordance with the invention.

Referring now the FIGS. 1a and 1d a preferred method of the invention will be described in connection therewith.

The method will be illustrated by the formation of a Group IV alloy thin film 14 on a suitable substrate 10 wherein by way of example the film is formed of Si$_x$Ge$_{1-x}$ wherein $0 < x < 1$ and the substrate is formed of Si since such a combination is highly desirable for high speed integrated circuit applications. It is to be understood however that any Group IV alloy may be formed and oxidized or nitrized in accordance with the invention. Other potential Group IV alloys include any alloy combination of C, Si, Ti, Ge Zr, Sn and Hf although presently Si$_x$Ge$_{1-x}$ has the greatest potential for semiconductor applications.

A silicon wafer 10 is cleaned and dried and quickly loaded into a Combined Ion Beam Molecular Beam Deposition (CIMD) chamber of the type described in the Herbot et al. U.S. Pat. No. 4,800,100 (incorporated herein by reference) at an ultra high vacuum of 10$^{-9}$ to 10$^{-10}$ Torr. An optional buffer layer 12 of 0.1 microns thick epitaxial silicon is formed by MBE on wafer 12. Next, an alloy layer 14 of 0.1 microns thick Si$_x$/Ge$_{1-x}$ with X=0.8 is deposited by simultaneous MBE of Si and Ge at a wafer temperature of 500°-550° C.

Without breaking vacuum, the alloy layer 14 is oxidized by IBO using O$^+$ or O$_2$ ions to oxidize layer 14 to a depth of about 0.01 microns forming oxide layer 16. The oxide can be formed at a wafer temperature ranging from a room temperature of 300K to 900K, with oxygen ion energies between 0.015 and 3 keV, although best results are obtained at lower energies in the order of 100 to 200 eV.

A capping layer 18 of 0.02 microns thick SiO$_2$ is formed over the oxide layer 16 promptly thereafter by IBO and Si MBE (CIMD). Layer 18 is a protective layer which allows the structure to be removed from the UHV chamber for processing into devices without damaging the oxides 18 & 16.

Figure 1B:
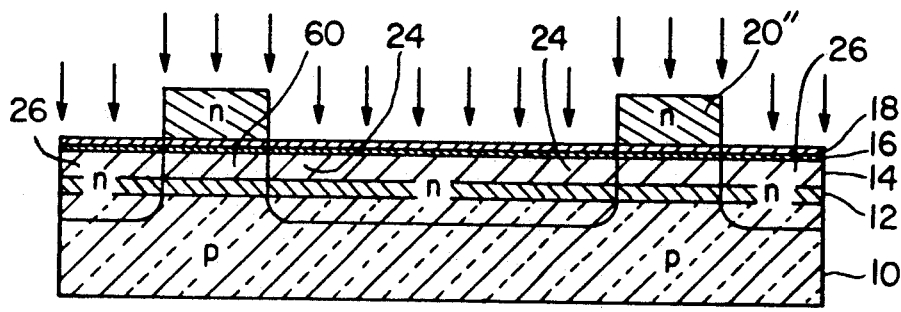

An optional layer 20 of polysilicon may be formed by MBE on layer 18 as shown in dotted lines in FIG. 1a before removal from the chamber. This polysilicon layer may be used as the gate electrode for MOSFET devices in a self-aligned gate process, as will be shown in connection with FIGS. 1b–1d.

To form N-type MOSFETS 100 and 102, first the polysilicon is etched except where gate electrodes 20' are to be formed, using well known photolithographic techniques. Source 26, gate 20" and drain 24 regions are then formed by ion beam implantation with impurities of suitable conductivity. Alternatively, the electrode regions may be doped during CIMD formation of the films by co-depositing dopants from an MBE source.

For N-MOS structures 100,102, n-type impurities such as phosphorous atoms would be implanted to dope the structure to n-type conductivity down to the substrate 10. Note: It is assumed that the substrate wafer is p-type as supplied. If not p-type donors, such as boron may be implanted initially to form a p-type substrate.

Figure 1C:
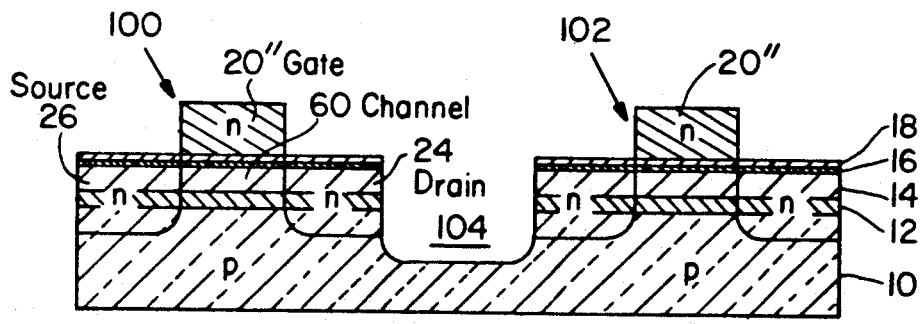
Figure 1D:
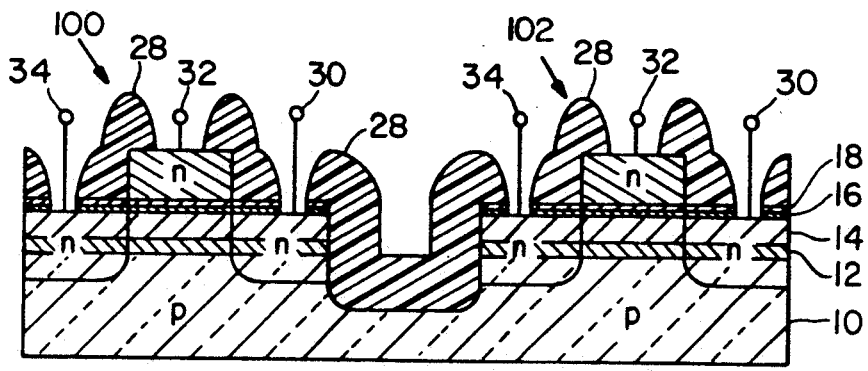

The polysilicon gate 20" acts as a mask preventing implantation of n-type ions beneath the gate 20" thereby forming a p-type channel region 60 between the source 26 and drain 24. As shown in FIG. 1c, a trench 104 may be formed between devices 100 and 102; such as by reactive ion etching to isolate devices.

A thick isolation oxide layer 28 is then formed, as by a Low Temperature Oxidation (LTO) process or CIMD, over the structure. Layer 28 is selectively etched away down to the device electrode regions and contacts 34, 32 and 30 are formed by a conventional metal evaporation process to complete the device structure.

B. HBT Structures

Figure 2:
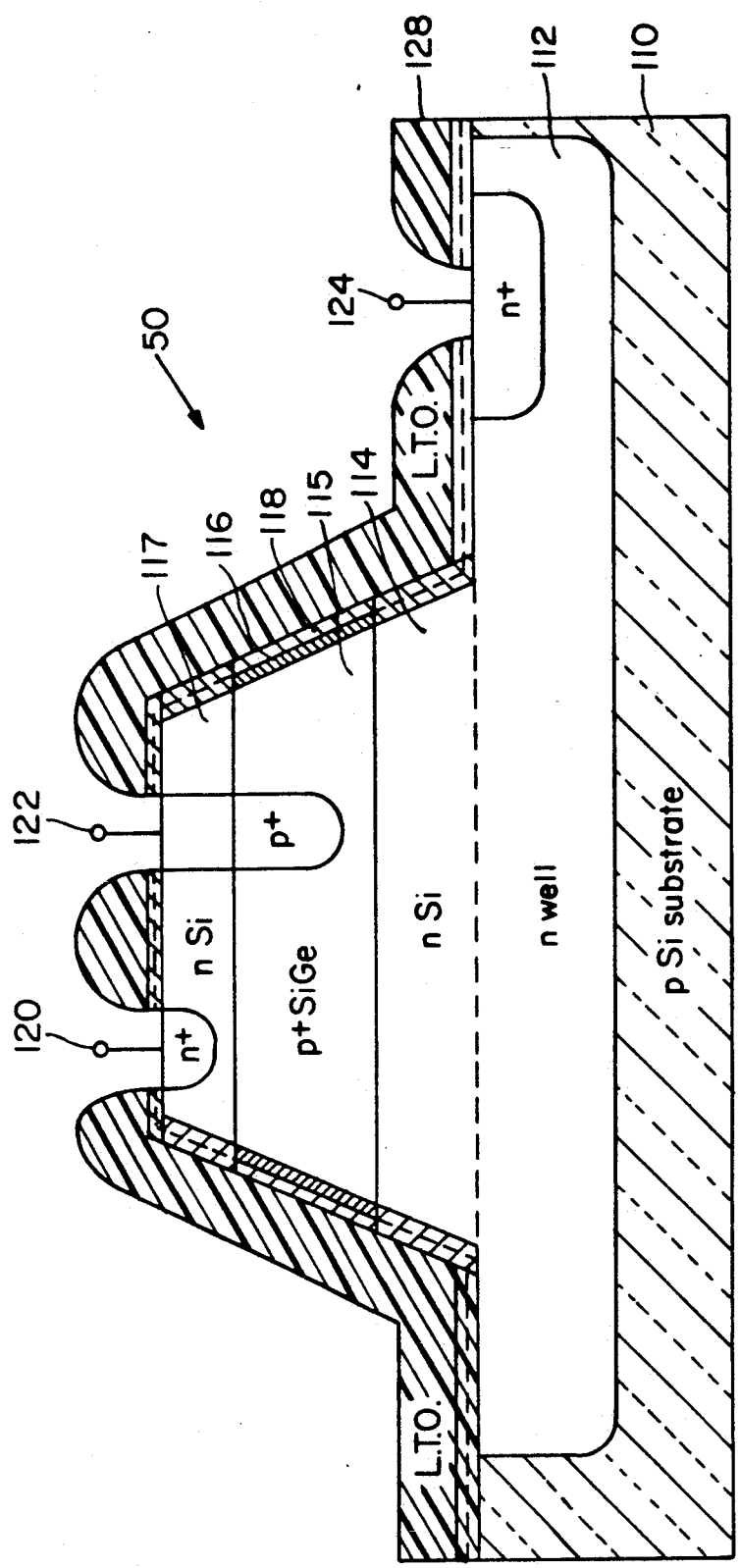
FIG. 2 is a schematic cross-section of a SiGe HBT in accordance with the invention.

As shown in FIG. 2 a Group IV alloy based heterojunction n-p-n bipolar transistor (HBT) 50 can also be formed in accordance with the invention. In FIG. 2 the precursor structure is a p-doped Si substrate 110 supplied with an n-type isolation well 112. Successive layers of n-doped Si, p+doped SiGe and n-doped Si are formed on substrate 110 by MBE in a CIMD chamber and the layers etched away on all sides to form a mesa with collector 114, base 115, and emitter 117 regions.

The exposed mesa structure is then subjected to IBO in situ forming an Si$_x$Ge$_{1-x}$O$_x$ layer 116 on the sidewall of base 115 and an SiO$_2$ layer 118 over the side-walls of the emitter 117 and collector 114. When layer 116 achieves a sufficient thickness Si is added by MBE and combines with the O$_2$ ion beam to form a protective SiO$_2$ layer 118 over the mesa structure. An LTO layer of thick oxide 128 is then formed over the structure and etched away to expose contact regions for diffusing or implanting dopants to form ohmic contacts 120, 122, 124 to the emitter, base and collector regions 117, 115, 114 respectively.

C. BICMOS Structures

FIG. 3A illustrates a precursor structure for the BICMOS structure 90 shown in cross-section in FIG. 3B. The structure 90 consists of successive layers of n Si 114', SiGe 14', P+SiGe and n-type Si 117' formed on P-type Si substrate 10' formed with n-type wells 112'.

FIG. 3B illustrates the completed structure comprising a bipolar transistor 50' and a complementary MOS structure of p-n-p MOS device 100' laterally disposed opposite n-p-n MOS device 102' on a Si substrate forming an integrated BICMOS device of a Group IV alloy in accordance with an alternate embodiment of the invention.

The structures of the CMOS device comprising MOS devices 100' and 102' are fabricated as in FIG. 1 except that an n-well 112' is included in the substrate for isolation because the conductivity of the channel 60' is reversed to p-type conductivity for the n-p-n MOS device 100'. The layers 114', 14', 115' and 117' for both devices are formed simultaneously by CIMD and afterwards processing of each device may be accomplished separately as required. While the CMOS devices 100' and 102' are being fabricated the Bipolar transistor region may be masked in situ and then processed as in FIG. 2 while the CMOS region is covered. This is made possible by the low temperature nature of the CIMD process which does not adversely affect previously formed devices. Note that bipolar transistor 50' has an added layer 14' not found in FIG. 2. This layer is not needed in the bipolar transistor, but is required for the channel 60' of the CMOS devices.

Table I below summarizes experimental data for producing IBN of Si, Ge, SiGe and IBO of Si and Ge at various ion beam energy levels i.e. 100, 200, 500, 1000 eV and the resulting % of the various constituents formed thereby.

TABLE I

| Energy | 100 | 200 | 500 | 1,000 |
|---|---|---|---|---|
| IBN Si | | | | |
| % Si | 50 | 47 | 45 | 45.5 |
| % N | 50 | 53 | 55 | 54.5 |
| % Si—N | 75 | 82.5 | 91 | 95.4 |
| N/Si | 1.38 | 1.37 | 1.34 | 1.25 |
| IBN Ge | | | | |
| % Ge | 62 | 64.6 | 73 | 75 |
| % N | 38 | 35.4 | 27 | 25 |
| % Ge—N | 38.5 | | | |
| IBN SiGe | | | | |
| % Si | 42.8 | 41.5 | 44 | 44.8 |
| % Ge | 4.8 | 4.5 | 4 | 3.7 |
| % N | 52.4 | 54 | 52 | 51.5 |
| % Si—N | 72.4 | 80 | 79 | 87.2 |
| Si Ge—N | 42.9 | 54.4 | 36 | 53 |
| Ge/(Si + Ge) | 38.5 | 82.5 | 1.34 | 45.5 |
| IBO Si | | | | |
| % Si | | 36.5 | 33.5 | |
| % O | | 63.5 | 66.5 | |
| % Si—O | | 77.3 | 89.4 | |
| O/Si | | 2.25 | 2.2 | |
| IBO Ge | | | | |
| % Ge | | 34 | | |
| % O | | 66 | | |
| % Ge—O | | 70 | | |
| O/Ge | | 2.8 | | |

D. Nitride Structures

Heretofore silicon nitride structures have typically been formed by Low Pressure Chemical Vapor Deposition (LPCVD) or Plasma Enhanced CVD (PECVD) at low pressure. As reported in the text Electronic Materials Science: For Integrated Circuits in Si and GaAs, by Mayer et al. P. 270 Table 9.6 J. W. Mayer and S. S. Lau, "Electronics Materials Science for Integrated Circuits," MacMillan, N.Y. (1990) the stress of such films, as deposited, on Si is tensile for LPCVD and may be either compressive or tensile for PECVD. Utilizing the IBN process of the present invention low temperature nitride films can be grown without subjecting the films to strain relaxation due to thermal expansion and/or mismatch in atomic arrangement between $Si_3N_4$ and the Si substrate which leads to cracking. The ion beam process forms films in compressive strain rather than tensile strain, as is usually found in low temperature deposited nitride films which tend to be porous. The amount of compressive strain, which is related to the ion beam compaction effect of Direct Ion Beam Nitridation (DIBN), can be adjusted by the ion beam energy, over more than order of magnitude: low energies ($<100$ eV) give low strain, while higher energies ($>200$ eV) tend to increase it. In addition, by using selective thermal anneals, the strain obtained by DIBN can be modulated from compressive to tensile or adjusted to be nihil. These strain-free nitride films have a wide range of applications, from stress-free semiconductor passivation and packaging, to coatings to nitride layers used in nanotechnology.

The low reactivity of Si nitride films, combined with the unique control of smoothness and thickness by DIBN, makes IBN nitrides uniquely suited for multi-layer applications where very thin films of low reactivity and sharp and smooth interfaces are needed, such as in X-ray mirrors.

The technique used to measure strain include curvature measurements by stylus and thickness measurements by cross-section TEM microscopy. Stoichiometry is quantified by ESCA. Refraction index is measured by combining ellipsometry with cross-section TEM. The nitrides are grown by direct reaction of a low energy nitrogen ion beam with a substrate or a thin film having been grown heteroepitaxially or amorphous by MBE temperature, at liquid nitrogen temperature and in a continuous temperature range from 77 K to 1700 K.

Figure 4:
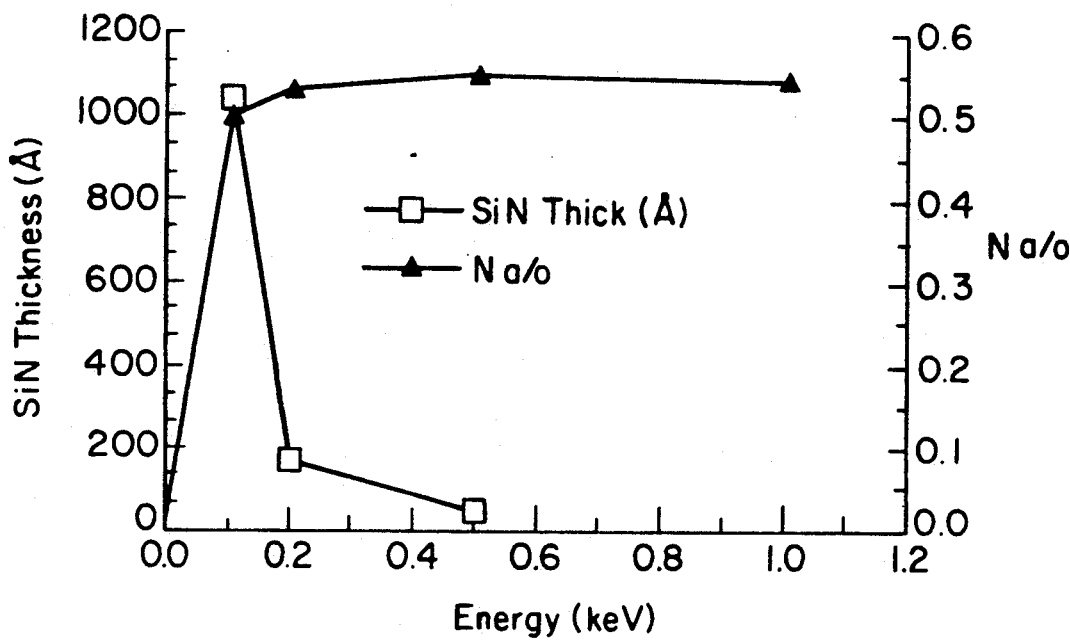
FIG. 4 is a plot of SiN thickness ($\square$) versus ion beam energy level and amount of nitridation (a/o) labelled $\triangle$.
Figure 5:
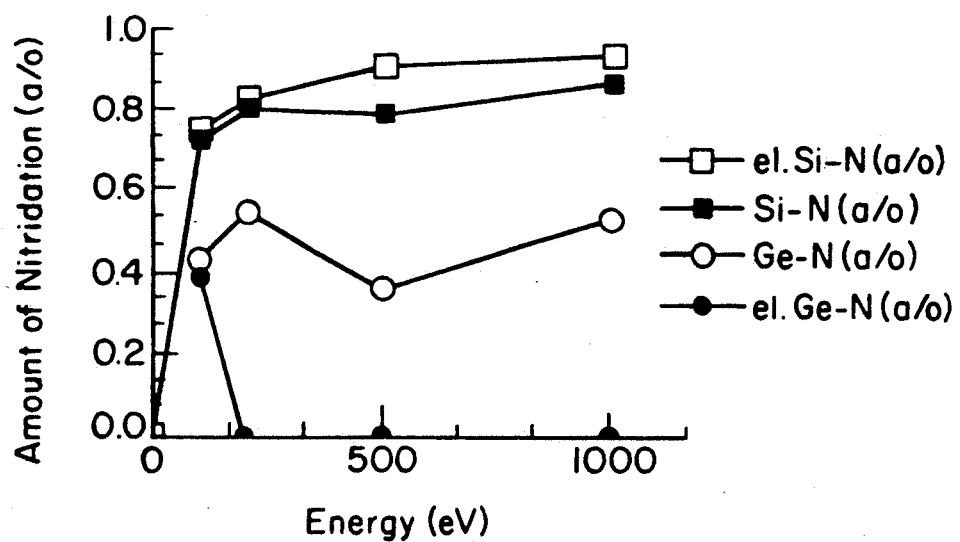
FIG. 5 is a plot of amount of nitridation versus ion beam energy level for various structures.

Unique properties have been achieved using this process. The stoichiometry and thickness of the nitride films can be controlled independently by temperature and ion energy as shown in the plots of FIGS. 4 & 5. It can be seen that the amount of N (FIG. 4) and nitrided Si (FIG. 5) increases as a function of E, resulting in differences in atomic density, atomic structure, and strain at the interface. This has important implication in strain control in nitride films grown over Si substrate films for instance.

Directly ion beam grown films with a well controlled directionality (normal incidence) and ion energy have highly reproducible and controllable properties, especially in regard to atomic density.

Figure 6:
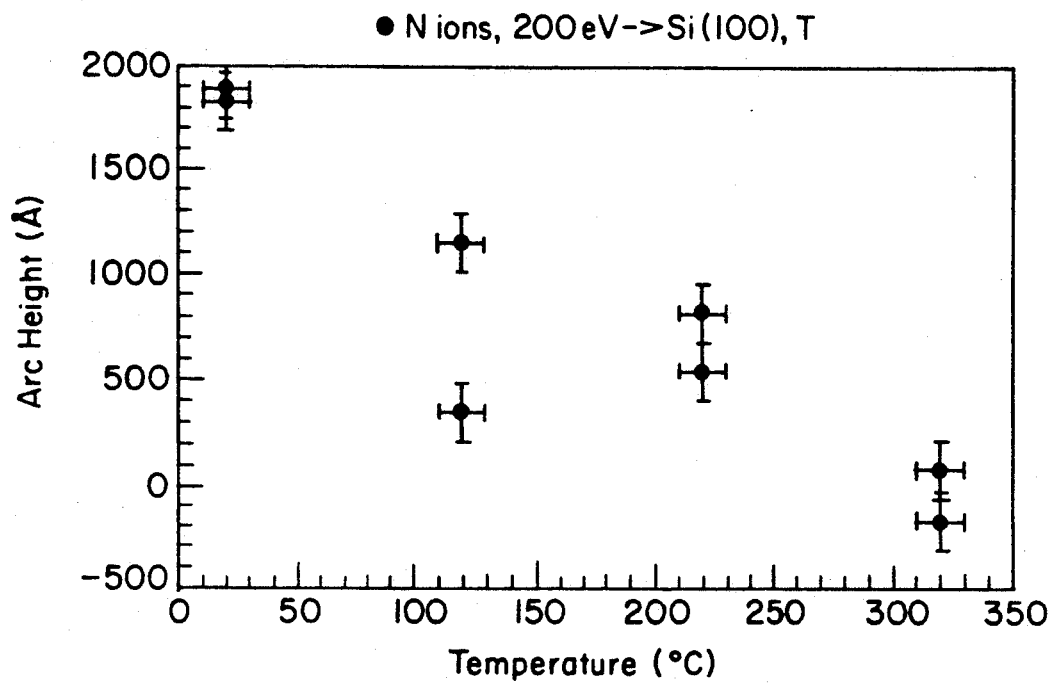
FIG. 6 is a plot of wafer curvature (Arc Height) in Å versus temperature for IBN of Si with 200 eV and 100 eV.
Figure 7:
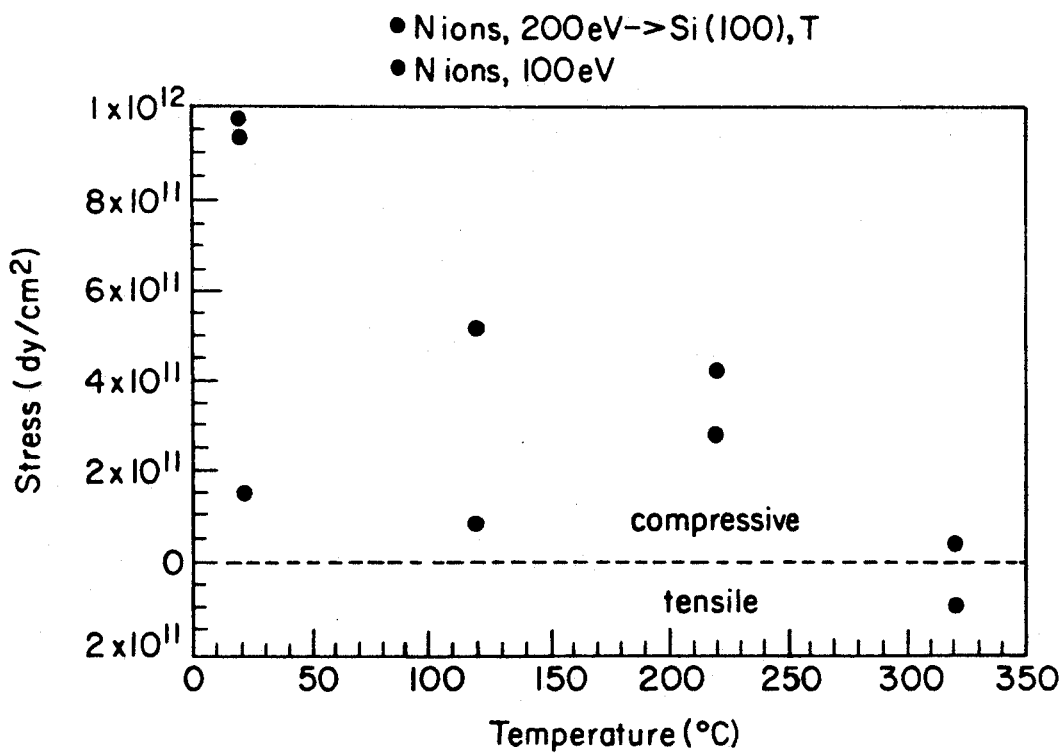
FIG. 7 is a plot of stress in dyne/cm$^2$ versus temperature in °C. for IBN of Si using N ions at 200 eV and 100 eV.

This is shown in FIGS. 6 and 7 where the amount of stress in a nitride film is shown to decrease linearly with processing temperature for a given energy, from a very high value of compression to tensile. The plots also show a variation of one and a half order magnitude in stress for a given temperature by simply changing the energy of deposition.

The plot of FIG. 6 illustrates how the stress in a SiN film formed on a Si (100) substrate by IBN may be predictably varied from tensile to compressive over a wide range by adjusting the temperature and energy of deposition, or by a thermal anneal after deposition at a reflected energy and temperature. The same procedure can be used to adjust the electronic properties, such as interface density of states of IBO and CIMD oxides of Group IV alloys on heterostructures.

Figure 8:
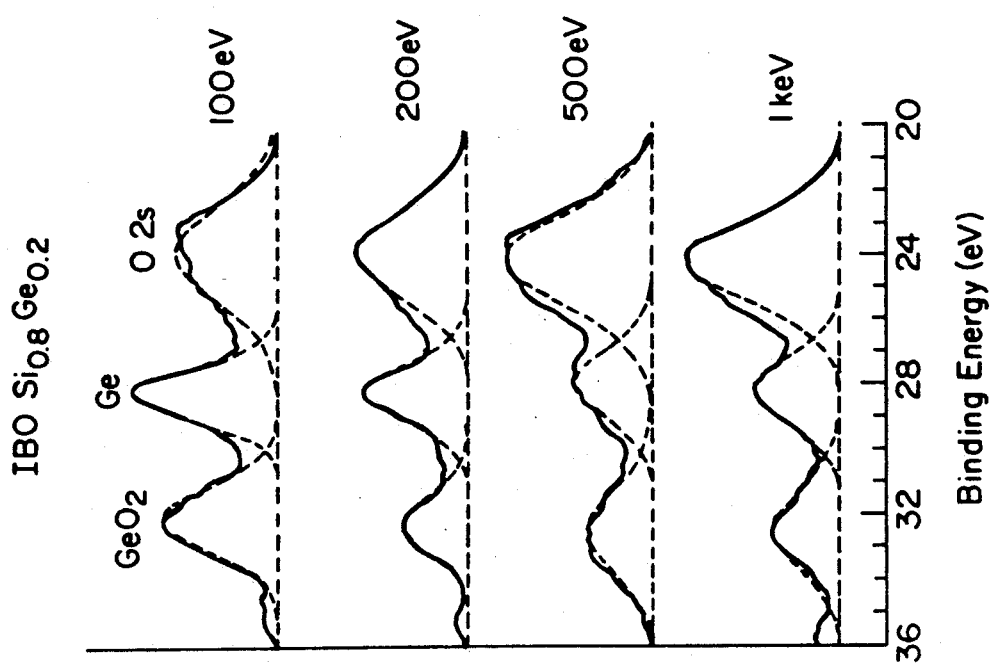
FIG. 8 is a plot of the material composition of Si$_x$Ge$_{1-x}$ where x=0.8 after IBO for different energy levels.

FIG. 8 is a plot of the material composition of $Si_x Ge_{1-x}$ where $x = 0.8$ after IBO for different energy levels.

Figure 9:
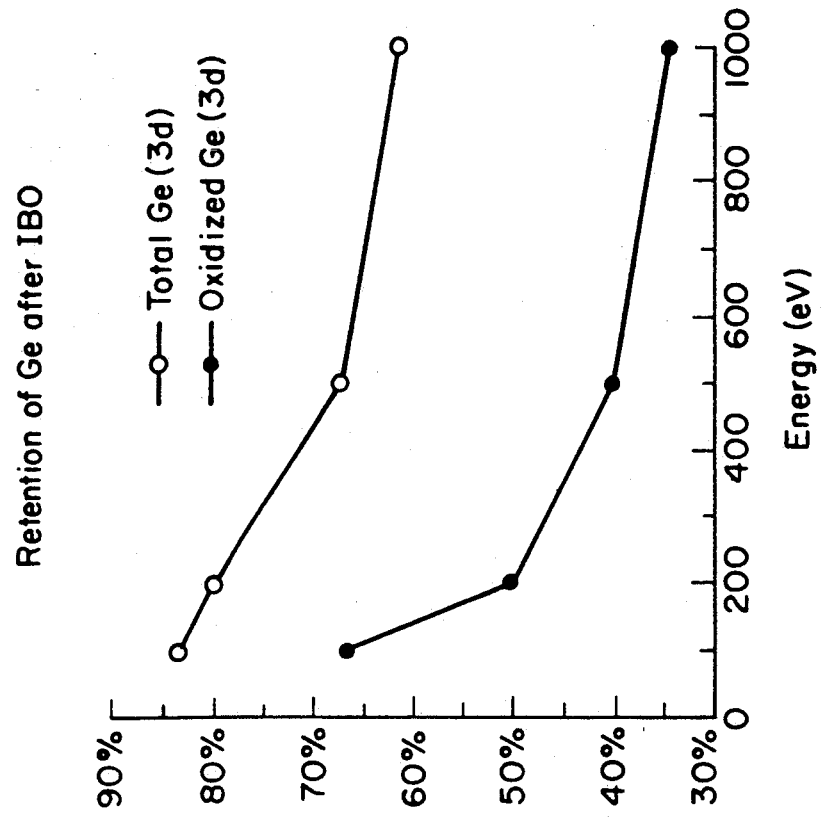
FIG. 9 is a pilot of the percent Ge retained after IBO versus energy, level for oxidized Ge curve ($\bullet$) and total Ge curve (O).

FIG. 9 is a plot of the percent Ge retained after IBO versus energy level for oxidized Ge curve (●) and total Ge curve (0).

Figure 10:
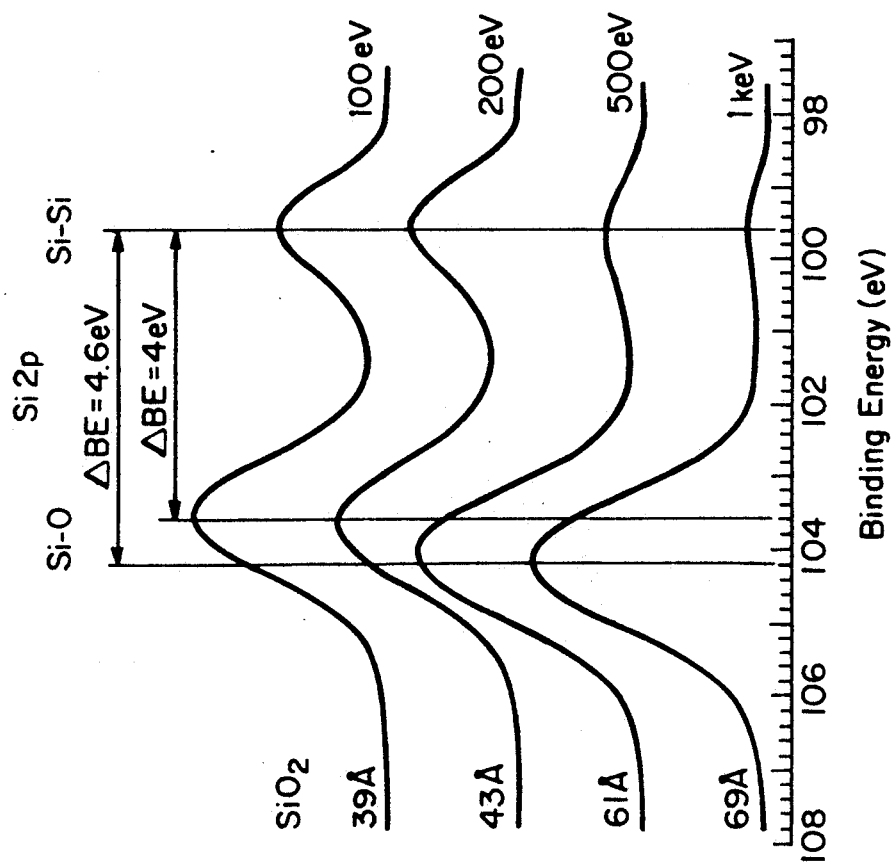
FIG. 10 is a plot of composition of Si samples oxidized by IBO at various energy levels.

FIG. 10 is a plot of composition of Si samples oxidized by IBO at various energy levels.

Figure 11:
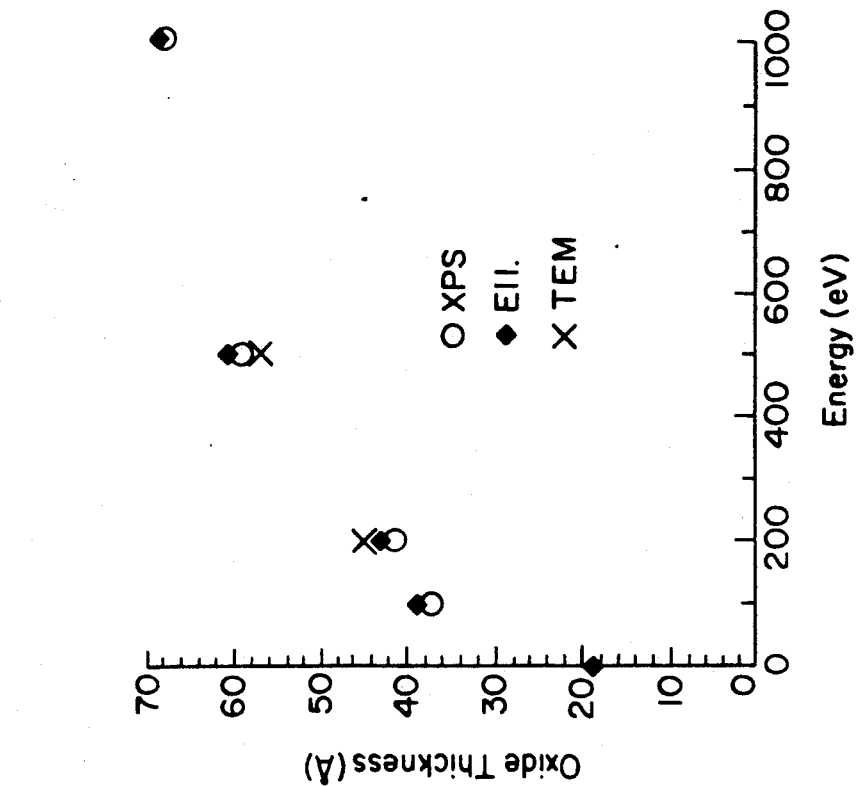
FIG. 11 is a plot of oxide thickness per energy level of the samples of FIG. 10 as measured by various techniques.

FIG. 11 is a plot of oxide thickness per energy level of the samples of FIG. 10 as measured by various techniques.

Equivalents

This completes the description of the preferred embodiments of the invention. Those skilled in the art will recognize, or be able to ascertain, using more than routine experimentation, many equivalents to the specific embodiments of the invention described herein.

These and all other equivalents are intended to be encompassed by the following claims.

For example N or $N_2$ may be substituted for O+ or $O_2$ ions in the embodiments of FIGS. 1-3 to form nitride insulators of $Si_2Ge_{1-x}$ in the MOS, CMOS, HBT and BICMOS structures.

Also, oxynitrides can be formed by this method by alternating N, O or $N_2$ and $O_2$ gas in the ion source. Another structure that can be formed is an oxide/nitride/oxide multilayer taking advantage of superior electronic properties of oxide interfaces versus superior dielectric strength in the bulk for nitrides and vice versa.

The method of adjusting stress in nitrides can also be applied to oxides to adjust stress and electronic properties.

It is also important to note that the layer thickness formed by the IBO and IBN process can be made self-limiting by controlling the energy level and/or wafer temperature and if thicker layers are desired, the process can be switched to use of an MBE deposited specie. Finally, while the layers formed using the properly prepared suitable substrates are generally epitaxial, as formed, amorphous films can be formed using very low temperatures.

We claim:

1. A structure formed of a Group IV alloy layer on a substrate with an insulative spacer formed of a material from the group comprising ternary compound oxides, nitrides, or quaternary compound oxynitrides of said alloy formed thereon.

2. The structure of claim 1 wherein the alloy is $Si_x Ge_{1-x}$ wherein $0 < x < 1$ and the insulative spacer is formed of $Si_x Ge_{1-x} O_y$ and $0 < y \leq 2$.

3. The structure of claim 2 wherein the substrate is formed of Si.

4. The structure of claim 1 wherein the alloy is $Si_x Ge_{1-x}$ wherein $0 < x < 1$ and the insulative spacer is formed of $Si_x Ge_{1-x} H_z$ and $0 < z \leq 4$.

5. A device formed on a substrate, the device having a structure comprising a source region and drain region with a channel region formed therebetween and a gate electrode formed over the channel region and spaced therefrom by a gate spacer and wherein the structure is formed of a heteroepitaxial Group IV alloy and the gate spacer is a dielectric from the group comprising ternary compound oxides, nitrides or quaternary compound oxynitrides of said alloy.

6. The device of claim 5 wherein the gate spacer is formed of a nitride of said alloy.

7. The device of claim 5 wherein the gate spacer is formed of material from the group comprising ternary oxides, nitrides or quaternary oxynitrides of said alloy.

8. The device of claim 7 in which the substrate is Si and the alloy is $Si_xGe_{1-x}$ where $0<x<1$.

9. A MOS device having a source and drain region separated by a channel region and wherein said regions are formed of a heteroepitaxial Group IV alloy on a substrate, a gate electrode over said channel region and insulated therefrom by a ternary oxide of said alloy.

10. A MIS device having a source and drain region separated by a channel region and wherein said regions are formed of a heteroepitaxy Group VI alloy on a substrate, a gate electrode over said channel region and insulated therefrom by a ternary nitride of said alloy.

11. The MIS device of claim 10 wherein the Group IV alloy is $Si_xGe_{1-x}$ and $0<x<1$.

12. A heterostructure bipolar transistor having a collector, base, and emitter formed of a doped Group IV alloy base disposed between a silicon collector and emitter and wherein a surface of said base is insulated by a ternary oxide of said alloy.

13. The transistor of claim 12 wherein the alloy is $Si_xGe_{1-x}$ in which $0<x<1$ and the oxide is $Si_xGe_{1-x}O_y$ in which $0<y\leq 2$.

14. A heterostructure bipolar transistor having a collector, base, and emitter formed of a doped Group IV alloy base disposed between a silicon collector and emitter and wherein a surface of said base is insulated by a ternary nitride of said alloy.

15. The transistor of claim 14 wherein the alloy is $Si_xGe_{1-x}$ which $0<x<1$ and the nitride is $Si_xGe_{1-x}N_z$ in which $0<x<4$.

16. An integrated structure comprised of a heterojunction bipolar transistor (HBT) device and a complementary metal insulator semiconductor (CMIS) device formed on a common substrate and wherein:
 a) the HBT comprises:
  (i) a collector, base, and emitter formed of a doped Group IV alloy base disposed between a silicon collector and emitter and wherein a surface of the base is insulated by a material taken from the group comprising a ternary oxide, a ternary nitride, or a quaternary oxynitride of said alloy;
 b) the CMIS device comprises a pair of metal insulator semiconductor devices formed laterally adjacent each other and each having;
  (i) a source and drain region separated by a channel region and wherein said regions are formed of a heteroepitaxial Group IV alloy on a substrate, and
  (ii) a gate electrode over said channel region and insulated therefrom by a material taken from the group comprising a ternary oxide, a ternary nitride, or a quaternary oxynitride of said alloy.

17. The integrated structure of claim 16 wherein the Group IV alloy is $Si_xGe_{1-x}$ and $0<x<1$.

* * * * *

UNITED STATES PATENT AND TRADEMARK OFFICE
CERTIFICATE OF CORRECTION

PATENT NO. : 5,241,214

DATED : August 31, 1993

INVENTOR(S) : Nicole Herbots, Olof C. Hellman and Olivier P.J. Vancauwenberghe

It is certified that error appears in the above-identified patent and that said Letters Patent is hereby corrected as shown below:

Col. 10, line 6, delete "$0<x<4$" and insert --$0<z\leq 4$--.

Signed and Sealed this

Fifth Day of April, 1994

Attest:

BRUCE LEHMAN

Attesting Officer

Commissioner of Patents and Trademarks